United States Patent
Ooshika (10) Patent No.: US 8,742,396 B2
(45) Date of Patent: Jun. 3, 2014

(54) III NITRIDE EPITAXIAL SUBSTRATE AND DEEP ULTRAVIOLET LIGHT EMITTING DEVICE USING THE SAME

(71) Applicant: Dowa Electronics Materials Co., Ltd., Tokyo (JP)

(72) Inventor: Yoshikazu Ooshika, Tokyo (JP)

(73) Assignee: Dowa Electronics Materials Co., Ltd., Tokyo (JP)

(*) Notice: Subject to any disclaimer, the term of this patent is extended or adjusted under 35 U.S.C. 154(b) by 0 days.

(21) Appl. No.: 13/739,362

(22) Filed: Jan. 11, 2013

(65) Prior Publication Data

US 2013/0181188 A1    Jul. 18, 2013

Related U.S. Application Data

(60) Provisional application No. 61/586,320, filed on Jan. 13, 2012.

(30) Foreign Application Priority Data

Jan. 10, 2013 (JP) ................ 2013-002657

(51) Int. Cl.
*H01L 29/12* (2006.01)
*H01L 29/66* (2006.01)

(52) U.S. Cl.
USPC .................................. 257/15; 257/194

(58) Field of Classification Search
CPC ......... H01L 33/04; H01L 33/32; H01L 33/30; H01L 33/325
USPC ................. 257/13–15, 18, E29.027, 29.298
See application file for complete search history.

(56) References Cited

U.S. PATENT DOCUMENTS

| | | | |
|---|---|---|---|
| 7,138,648 B2 * | 11/2006 | Kneissl et al. | 257/14 |
| 2001/0035531 A1 | 11/2001 | Kano et al. | |
| 2008/0251781 A1 | 10/2008 | Han et al. | |
| 2012/0223365 A1 * | 9/2012 | Briere | 257/194 |

FOREIGN PATENT DOCUMENTS

| | | |
|---|---|---|
| JP | A-2000-133842 | 5/2000 |
| JP | A-2003-077835 | 3/2003 |
| JP | A-2006-332125 | 12/2006 |
| JP | A-2007-67077 | 3/2007 |
| JP | A-2008-251643 | 10/2008 |
| JP | A-2009-158804 | 7/2009 |

OTHER PUBLICATIONS

U.S. Appl. No. 61/449,046, filed Mar. 2011, Briere, Michael A.*

(Continued)

*Primary Examiner* — Matthew Reames
*Assistant Examiner* — Vincent Wall
(74) *Attorney, Agent, or Firm* — Oliff PLC (57) ABSTRACT

A III nitride epitaxial substrate which makes it possible to obtain a deep ultraviolet light emitting device with improved light output power is provided. A III nitride epitaxial substrate includes a substrate, an AlN buffer layer, a first superlattice laminate, a second superlattice laminate and a III nitride laminate in this order. The III nitride laminate includes an active layer including an $Al_\alpha Ga_{1-\alpha}N$ ($0.03 \le \alpha$) layer. The first superlattice laminate includes $Al_a Ga_{1-a}N$ layers and $Al_b Ga_{1-b}N$ ($0.9 < b \le 1$) layers which are alternately stacked, where $\alpha(\text{alpha}) < a$ and $a < b$. The second superlattice laminate includes repeated layer sets each having an $Al_x Ga_{1-x}N$ layer, an $Al_y Ga_{1-y}N$ layer, and an $Al_z Ga_{1-z}N$ ($0.9 < z \le 1$) layer, where $\alpha(\text{alpha}) < x$ and $x < y < z$.

6 Claims, 4 Drawing Sheets

(56) References Cited

OTHER PUBLICATIONS

Veis, M. et al., "AlN/GaN superlattice quality improvement by using multiple superlattice structure," *Physica Status Solidi (C)*, 2008, pp. 1547-1549, vol. 5, No. 6.

Hertkorn, J. et al., "Transport properties in n-type AlGaN/Aln/GaN-superlattices," *Physica Status Solidi (C)*, 2008, pp. 1950-1952, vol. 5, No. 6.

Extended European Search Report issued in European Patent Application No. 13000146.4 on Jul. 4, 2013.

Dec. 5, 2013 Office Action issued in Korean Patent Application No. 520070081691(with translation).

Nov. 26, 2013 Office Action issued in Japanese Patent Application No. 2013-002657 (with translation).

* cited by examiner

III NITRIDE EPITAXIAL SUBSTRATE AND DEEP ULTRAVIOLET LIGHT EMITTING DEVICE USING THE SAME

TECHNICAL FIELD

The present invention relates to a III nitride epitaxial substrate and a deep ultraviolet light emitting device using the same.

BACKGROUND ART

In recent years, III nitride semiconductors generally made of compounds in which N is combined with Al, Ga, In, and the like are widely used for light emitting devices, elements for electronic devices, and the like. The characteristics of such devices greatly depend on the crystallinity of III nitride semiconductors; therefore, techniques for growing highly crystalline III nitride semiconductors are demanded.

A III nitride semiconductor is formed by performing epitaxial growth on a substrate made of sapphire, SiC, Si, GaAs, or the like. However, the lattice constant and the coefficient of thermal expansion are significantly different between the III nitride semiconductor and such a substrate. Accordingly, there has been a problem in that, if the III nitride semiconductor is grown on the substrate, the grown-up III nitride semiconductor causes cracks and pits (point-like defects). In view of this, it is known that a highly crystalline III nitride layer is grown by forming a buffer layer on a substrate, and then epitaxially growing a III nitride semiconductor layer on the buffer layer, thereby preventing the formation of cracks and pits due to the strain buffer effect of the buffer layer.

PTL 1 (JP 2007-067077A) discloses a technique of producing a highly crystalline III nitride semiconductor layer, in which crack formation is prevented, on a Si substrate by providing an AlN-based superlattice buffer layer, in which a plurality of first layers made of $Al_xGa_{1-x}N$ (Al content x: $0.5 \le x \le 1$) and a plurality of second layers made of $Al_yGa_{1-y}N$ (Al content y: $0.01 \le y \le 0.2$) are alternately stacked, between the Si substrate and the III nitride semiconductor layer.

PTL 2 (JP 2009-158804A) discloses a technique of obtaining a highly crystalline III nitride semiconductor layer. The III nitride semiconductor layer is formed on the superlattice composite layer by forming an AlN buffer layer on a Si substrate and sequentially stacking, on the AlN buffer, a composition graded layer having a composition graded such that the Al content decreases in the crystal growth direction, and a superlattice composite layer, in which high Al-content layers and low Al-content layers are alternately stacked.

CITATION LIST

Patent Literature

PTL 1: JP 2007-067077A
PTL 2: JP 2009-158804A

SUMMARY OF INVENTION

Technical Problem

The inventor of the present invention studies a deep ultraviolet light emitting device in which an active layer made of AlGaN material, which includes a light emitting layer emitting deep ultraviolet light is epitaxially grown on a substrate made of sapphire or SiC. In order to achieve high light output power, a highly crystalline high-quality active layer is required to be grown on the substrate. Note that "deep ultraviolet light" herein means light in the wavelength range of 200 nm to 350 nm.

However, the studies made by the inventor of the present invention revealed that sufficient light output power cannot be achieved even if a deep ultraviolet light emitting device is produced by forming a buffer layer disclosed in PTL 1 or PTL 2 on a substrate made of sapphire or SiC instead of a Si substrate and forming a III nitride semiconductor layer on the buffer layer. In recent years, deep ultraviolet light emitting devices have attracted attention as light emitting devices that can be widely used in the fields of sterilization, water purification, medical treatment, illumination, high-density optical recording, and the like, and they are required to achieve higher light output power.

In view of the above problems, it is an object of the present invention to provide a III nitride epitaxial substrate which makes it possible to obtain a deep ultraviolet light emitting device with improved light output power, and to provide a deep ultraviolet light emitting device with improved light output power.

Solution to Problem

In order to achieve the above object, the present invention primarily includes the following components.

(1) A III nitride epitaxial substrate comprising:
a substrate;
an AlN buffer layer formed on the substrate;
a first superlattice laminate and a second superlattice laminate sequentially formed on the buffer layer; and
a III nitride laminate having an active layer including an $Al_\alpha Ga_{1-\alpha}N$ ($0.03 \le \alpha(\text{alpha})$) layer epitaxially grown on the second superlattice laminate,
wherein the first superlattice laminate includes first layers made of $Al_a Ga_{1-a}N$ and second layers made of $Al_b Ga_{1-b}N$ ($0.9 < b \le 1$) which are alternately stacked, where $\alpha(\text{alpha}) < a$ and $a < b$, and
the second superlattice laminate includes repeated layer sets each having a third layer made of $Al_x Ga_{1-x}N$, a fourth layer made of $Al_y Ga_{1-y}N$, and a fifth layer made of $Al_z Ga_{1-z}N$ ($0.9 < z \le 1$), where $\alpha(\text{alpha}) < x$ and $x < y < z$.

(2) The III nitride epitaxial substrate according to (1) above, wherein $z - x \ge 0.20$.

(3) The III nitride epitaxial substrate according to (1) or (2) above, wherein difference in Al content between adjacent layers in the first and second superlattice laminates is 0.05 or more and 0.40 or less.

(4) The III nitride epitaxial substrate according to any one of (1) to (3) above, wherein $y - x$ is smaller than $z - y$.

(5) The III nitride epitaxial substrate according to any one of (1) to (4) above, wherein $0.20 \le x < 0.90$ and $0.60 \le y < 0.95$.

(6) The III nitride epitaxial substrate according to any one of (1) to (5) above, wherein $a > x$.

(7) The III nitride epitaxial substrate according to any one of (1) to (6) above, wherein the substrate is made of a material selected from the group consisting of sapphire, SiC, and diamond.

(8) A deep ultraviolet light emitting device using the III nitride epitaxial substrate according to any one of (1) to (7) above.

Advantageous Effect of Invention

The present invention can provide a III nitride epitaxial substrate which makes it possible to obtain a deep ultraviolet light emitting device with improved light output power, and can provide a deep ultraviolet light emitting device with improved light output power.

DESCRIPTION OF EMBODIMENTS

Figure 1:
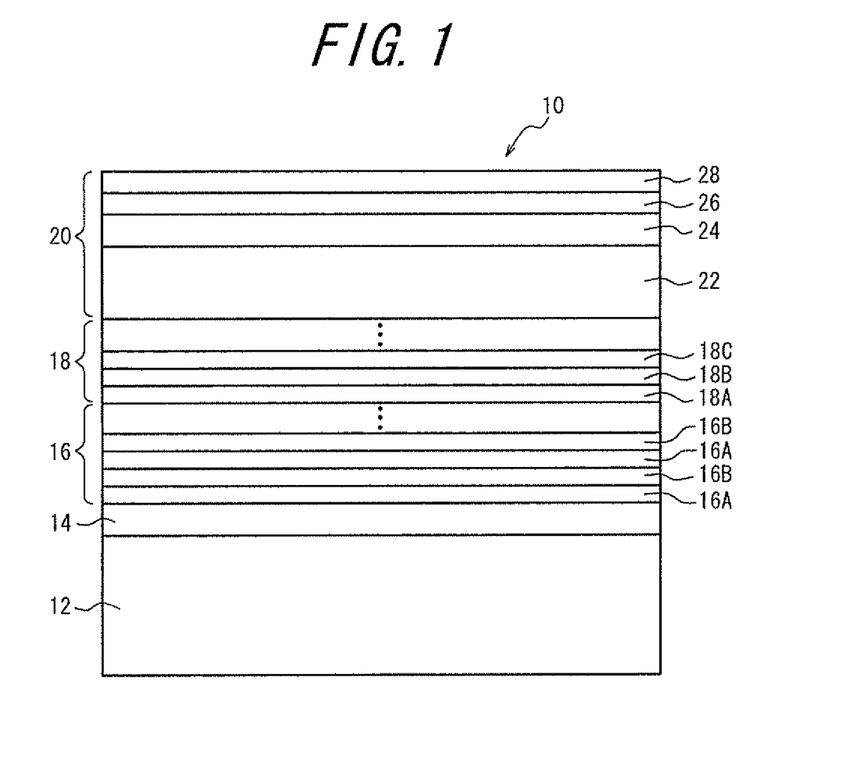
FIG. 1 is a schematic cross-sectional view of a III nitride epitaxial substrate according to the present invention.

Embodiments of a III nitride epitaxial substrate of the present invention will be described below with reference to the drawings. FIG. 1 schematically shows a cross-sectional structure of a III nitride epitaxial substrate 10 which is an embodiment of the present invention.

The III nitride epitaxial substrate 10 includes a substrate 12, an AlN buffer layer 14 formed on the substrate 12, a first superlattice laminate 16 and a second superlattice laminate 18 sequentially formed on the buffer layer 14, and a III nitride laminate 20 epitaxially grown on the second superlattice laminate 18.

The substrate 12 is preferably a substrate that exerts compressive stress on the AlN buffer layer 14, the first superlattice laminate 16, and the second superlattice laminate 18 (hereinafter the AlN buffer layer 14, the first superlattice laminate 16, and the second superlattice laminate 18 are collectively referred to as a "buffer layer"). Examples of the substrate 12 include substrates made of sapphire, SiC, diamond, and the like. A Si substrate is a substrate that exerts tensile stress on the buffer layer; therefore, it is not preferable as the substrate 12 used in the present invention.

Whether compressive stress is exerted on the buffer layer or tensile stress is exerted thereon depends on the difference in the lattice constant and in the thermal expansion coefficient between the material of the substrate and the AlN buffer layer. The lattice constant of the substrate here corresponds to the lattice constant of the surface of the substrate where the buffer layer is grown. When a sapphire substrate is used, for example, since the lattice constant of sapphire is larger than that of AlN, tensile stress is exerted on AlN during the growth of AlN. Meanwhile, the thermal expansion coefficient of sapphire higher than that of AlN causes excessive shrinkage of the sapphire substrate when a buffer layer is epitaxially grown and cooled. Thus, compressive stress higher than the tensile stress exerted during the growth acts on the buffer layer. Further, when a SiC substrate is used, although there is little difference in the thermal expansion coefficient between SiC and AlN, a lattice constant of SiC smaller than that of AlN causes compressive stress acting on the buffer layer. The thickness and the size of the substrate can be appropriately selected depending on the application. In general, the thickness of the substrate is significantly larger than that of a buffer layer. Note that the crystal plane of a substrate used is, for example (0001) plane, and its lattice constant is compared with respect to the a-axis lengths to be AlN (3.11 angstroms), sapphire (4.76 angstroms), and SiC (3.08 angstroms). The thermal expansion coefficients are AlN (4.2), sapphire (7.5), and SiC (4.2) (each measured in ppm/K).

The III nitride laminate 20 includes an active layer 24 including an $Al_\alpha Ga_{1-\alpha}N$ ($0.03 \le \alpha$) layer. In this embodiment, the III nitride laminate 20 includes an n-type AlGaN layer 22, an active layer 24, a p-type AlGaN layer 26, and a p-type GaN contact layer 28 in this order from the second superlattice laminate 18 side. The n-type AlGaN layer 22, the p-type AlGaN layer 26, and the p-type GaN contact layer 28 can be formed by epitaxial growth using a known method such as MOCVD. P-type impurities can be exemplified by Be and Mg, whereas n-type impurities can be exemplified by Si and Ge.

The active layer 24 can be a light emitting layer in which a multiple quantum well (MQW) structure is formed of, for example, an AlGaN-based material. The light emitting layer can be formed by epitaxial growth using MOCVD or the like. In this embodiment, the well layer in the multiple quantum well structure is an $Al_\alpha Ga_{1-\alpha}N$ ($0.03 \le \alpha$) layer. In this case, the active layer 24 is a light emitting layer emitting deep ultraviolet light with an emission peak wavelength of 350 nm or less. Note that in the case of using an AlGaN-based multiple quantum well structure, the emission wavelength can be mainly controlled with the Al content of the well layer. A higher Al content causes emission of light with a shorter wavelength. For example, when the Al content of the well layer is set to 0.4, 280 nm deep ultraviolet light can be emitted from the active layer 24.

The thickness of each layer is not limited in particular. For example, the thickness of the n-type AlGaN layer 22 can be 500 nm to 5000 nm; the active layer 24: 20 nm to 1000 nm; the p-type AlGaN layer 26: 20 nm to 500 nm; and the p-type GaN contact layer 28: 10 nm to 500 nm.

The III nitride epitaxial substrate 10 according to the present invention characteristically has the buffer layer disposed between the substrate 12 and the III nitride laminate 20. The buffer layer includes the AlN buffer layer 14, the first superlattice laminate 16, and the second superlattice laminate 18 in this order from the substrate 12 side. The first superlattice laminate 16 includes first layers 16A made of $Al_a Ga_{1-a}N$ and second layers 16B made of $Al_b Ga_{1-b}N(0.9 < b \le 1)$ which are alternately stacked. Here, the conditions $\alpha(alpha) < a$ and $a < b$ are satisfied. Further, the second superlattice laminate 18 includes repeated layer sets each having a third layer 18A made of $Al_x Ga_{1-x}N$, a fourth layer 18B made of $Al_y Ga_{1-y}N$, and a fifth layer 18C made of $Al_z Ga_{1-z}N(0.9 < z \le 1)$. Here, the conditions $\alpha(alpha) < x$ and $x < y < z$ are satisfied. With such a structure, the present invention is significantly effective in obtaining a deep ultraviolet light emitting device with improved light output power using the III nitride epitaxial substrate 10.

The technical meaning of employing such a structure will be described with the operation and effect. The inventor of the present invention studied a buffer layer structure, in particular, a variety of superlattice buffers in which AlN is first formed on the substrate 12 side, and then low Al content $Al_a Ga_{1-a}N$ (first layers) and high Al content $Al_b Ga_{1-b}N$ (a<b, $0.9 < b \le 1$, second layers) are alternately stacked thereon.

Figure 2A:
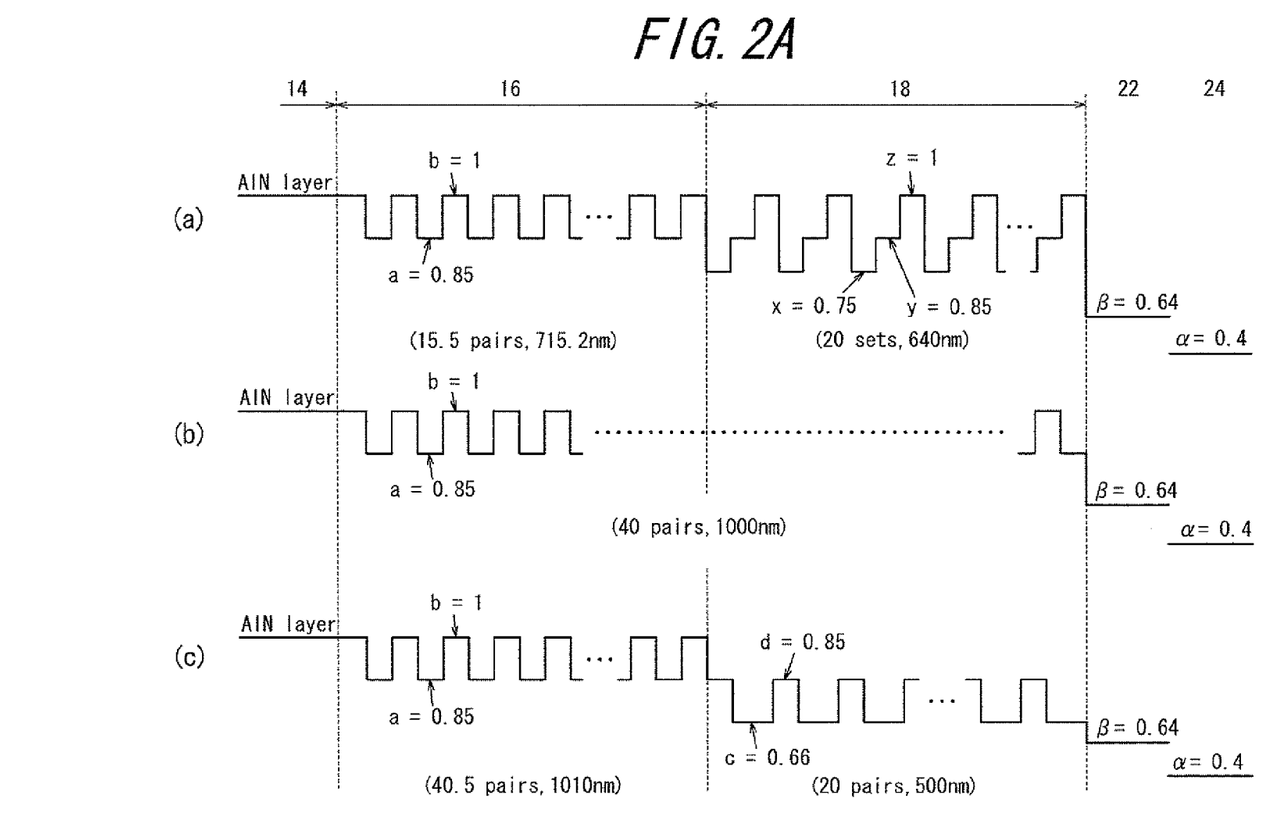
FIG. 2A is a schematic view for illustrating the Al content of superlattice laminates of Example 1, Comparative Examples 1, and Comparative Example 2, respectively.
Figure 2B:
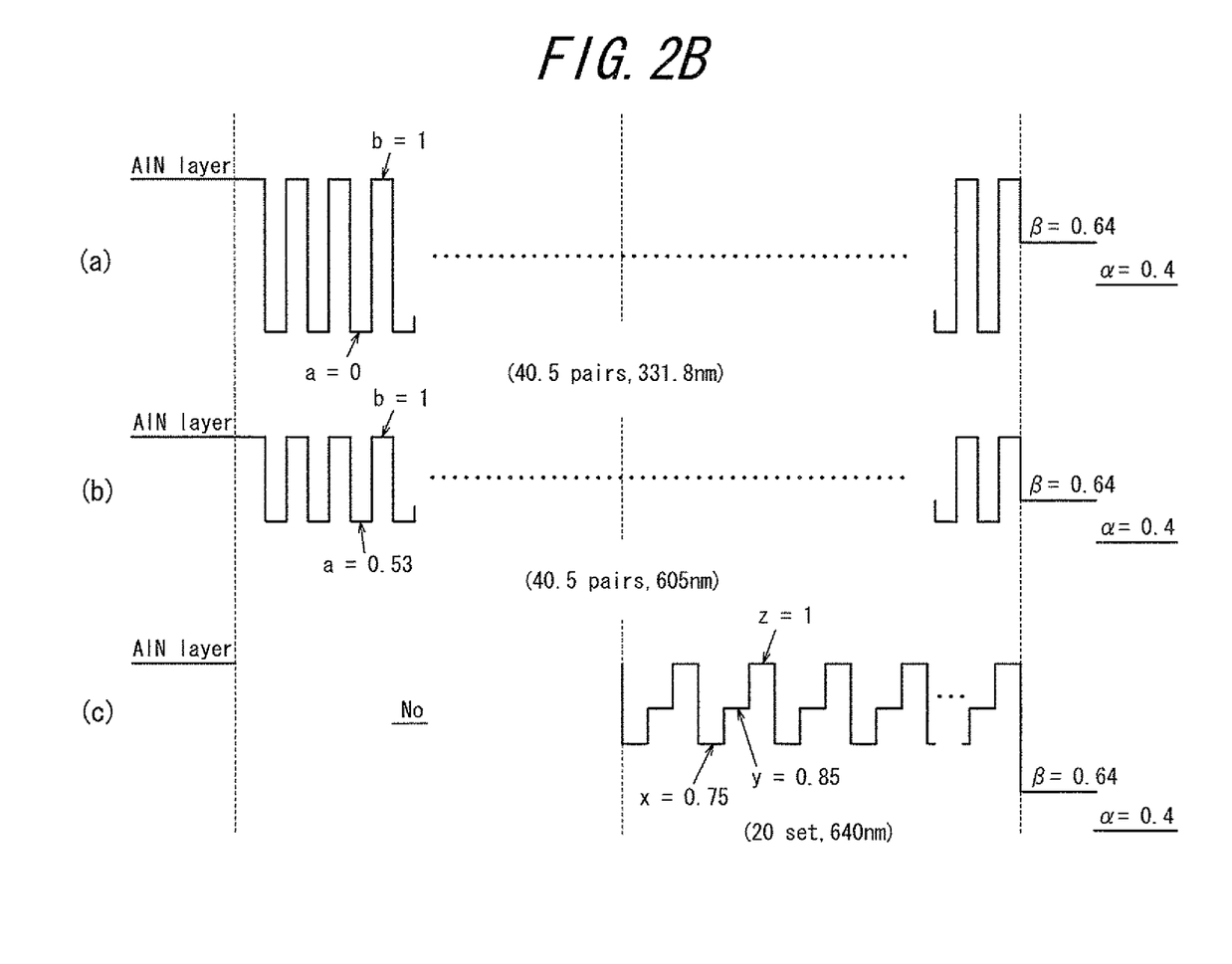
FIG. 2B is a schematic view for illustrating the Al content of superlattice laminates of Comparative Examples 3 to 5, respectively.

First, the superlattice laminate shown in FIG. 2B, section (a) in which GaN (first layers)/AlN (second layers) are alternately formed is beneficial in growing an AlGaN layer having a low Al content up to less than 3%, for example GaN, on the laminate. However, in the case of growing a III nitride semiconductor having an active layer including an $Al_\alpha Ga_{1-\alpha}N$ ($0.03 \le \alpha$) layer, aimed at by the present invention, the following problem became apparent. Specifically, the Al content of the first layer lower than the Al content α of the well layer results in a smaller band gap of the first layer than $Al_\alpha Ga_{1-\alpha}N$ ($0.03 \leq \alpha$). Accordingly, light emitted from the active layer is absorbed by the first layer, which leads to reduced light output power. When the first layer is formed for example to a small thickness of approximately 0.2 nm to 0.3 nm in order to minimize the absorption of light, the strain buffer effect (the effect of reducing the compressive stress from the substrate with the tensile stress in the superlattice laminate, to be described later) cannot be achieved sufficiently. Thus, sufficient light output power cannot be achieved either in this case.

When the Al content of the first layer is sufficiently higher than the Al content $\alpha$ of the well layer as in the superlattice laminate shown in FIG. 2A, section (b) in which $Al_{0.85}Ga_{0.15}N$ (first layers)/AlN (second layers) are alternately formed, light emitted from the active layer is not absorbed by the first layer. However, smaller difference in the Al content between the first layers and the second layers makes it impossible to achieve a sufficient strain buffer effect. On this occasion, the crystallinity of the III nitride laminate 20 formed on this buffer layer becomes insufficient; thus, sufficient light output power cannot be achieved.

This being the case, a superlattice laminate is considered in which $Al_{0.53}Ga_{0.47}N$ (first layer)/AlN (second layer) are alternately formed as shown in FIG. 2B, section (b) thereby keeping the Al content of the first layers higher than the Al content $\alpha$ of the well layer, and increasing the difference in the Al content between the first layers and the second layers as much as possible. However, in this case, it was found that cracks would be formed in the second layers. This is attributed to the following reason. The higher the Al content of AlGaN is, the worse the surface evenness becomes during the growth. Therefore, the first layers have a relatively uneven surface. Here, when second layers having an Al content greatly different from that of the first layers are formed, high tensile stress is exerted on the second layers, which is considered to cause cracks. The cracks of the second layers are undesirable because when they reach the III nitride laminate 20, the light emitting device cannot function properly. Incidentally, in the case of FIG. 2B, section (a), since GaN of the first layers are very even, cracks are not formed even when AlN is stacked thereon. In the case of FIG. 2A, section (b), the evenness of $Al_{0.85}Ga_{0.15}N$ in the first layer is not favorable; however, since the Al content of the first layers is not greatly different from that of the second layers, excessive tensile stress is not exerted on the second layers. Thus, cracks are not formed either.

Figure 3:
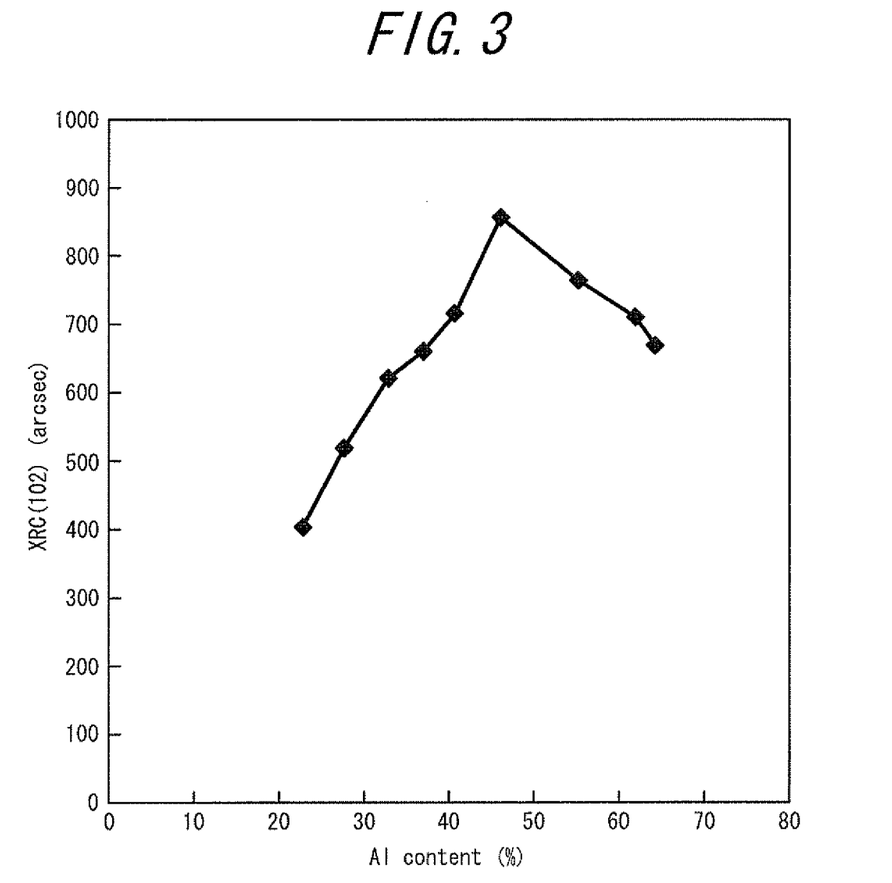
FIG. 3 is a graph showing the relationship between the Al content and the crystallinity of a single AlGaN layer epitaxially grown on an AlN template substrate.

FIG. 3 is a graph showing the relationship between the Al content and the crystallinity of a single AlGaN layer epitaxially grown on an AlN template substrate in which an AlN buffer layer is formed on a sapphire substrate. The horizontal axis represents the Al content (%), whereas the vertical axis represents the half-width of the peak corresponding to the (102) plane of each sample analyzed using an X-ray diffractometer. The smaller the half-width is, the better the crystallinity of the AlGaN layer is. The crystallinity is deteriorated as the Al content rises from about 20%, which considered to be attributed to the deterioration in evenness of the AlGaN layer. On the other hand, the crystallinity is improved as the Al content rises from about 50%, which considered to be attributed to the smaller difference in the Al content between the AlN buffer layer and the AlGaN layer. Seen from FIG. 3, when the AlGaN layer is adjacent to an AlN layer, it is difficult to achieve good crystallinity in the Al content range of 40% to 60%, where the half-width with respect to the (102) plane is approximately 700 or more. This shows that the Al content of the AlGaN layer adjacent to high Al content $Al_b Ga_{1-b}N$ ($0.9 < b \leq 1$) is preferably such that the difference in the Al content is out of the range of more than 0.4 and less than 0.6.

Thus, the inventor of the present invention concluded that in order to achieve a sufficient strain buffer effect while preventing formation of cracks and suppressing absorption of light, a simple superlattice laminates in which 2 layers are alternately formed has limits. To that end, the inventor found that the above objective can be achieved by providing a certain superlattice laminate in which repeated layer sets of 3 layers are formed, in addition to the superlattice laminate in which 2 layers are alternately formed. Thus, the inventor completed the present invention.

The III nitride epitaxial substrate 10 of this embodiment satisfies the conditions $\alpha < a$ and $a < b$ with respect to the first superlattice laminate 16, and satisfies the conditions $\alpha < x$ and $x \geq y < z$ with respect to the second superlattice laminate 18. That is, each layer in the superlattice laminate has an Al content higher than the Al content $\alpha$ of the well layer $Al_\alpha Ga_{1-\alpha}N$. Therefore, the light emitted from the active layer can be prevented from being absorbed by the first superlattice laminate 16 and the second superlattice laminate 18.

The second superlattice laminate 18 is designed to have a three-layer structure in which the Al contents of the third layers 18A, fourth layers 18B, and fifth layers 18C are higher in this order from the substrate 12 side, so that the third layers 18A exert tensile stress on the fourth layers 18B and the fourth layers 18B exert tensile stress on the fifth layers 18C. Thus, tensile stress is applied a plurality of times in incremental steps within a layer set, which allows the compressive stress exerted by the substrate 12 to be sufficiently reduced as compared with the foregoing two-layer structure. Thus, growth in the lateral direction, of the III nitride semiconductor layer 20 formed on the second superlattice laminate 18 can be promoted. As a result, the III nitride semiconductor layer 20 having higher crystallinity can be obtained.

Further, since the second superlattice laminate 18 has a three-layer structure, the difference in the Al content between adjacent layers can be easily reduced. Consequently, not too high tensile stress is applied to the fourth layer 18B and the fifth layer 18C, which can prevent cracks from being formed due to concentration of tensile stress in these layers.

Without being bound by theory, the III nitride epitaxial substrate 10 of this embodiment of the present invention is considered to be significantly effective due to the operation described above in obtaining a deep ultraviolet light emitting device with improved light output power.

Incidentally, as described below, when a superlattice laminate in which $Al_{0.66}Ga_{0.34}N$ (third layers)/$Al_{0.85}Ga_{0.15}N$ (first layers) are alternately formed is formed on a superlattice laminate in which $Al_{0.85}Ga_{0.15}N$ (first layers)/AlN (second layers) are alternately formed as shown in FIG. 2A, section (c), although three kinds of layers having different Al contents are included, a III nitride semiconductor layer formed on the superlattice laminate does not have sufficient crystallinity. Thus, high light output power cannot be achieved. This is attributed to the fact that lateral growth of the III nitride semiconductor layer cannot be promoted, since the Al content difference is not sufficient for applying tensile stress to the superlattice laminate in incremental steps unlike this embodiment, and the superlattice laminate does not have a structure designed to apply tensile stress a plurality of times to a set of layers.

Further, as also discussed below, when the first superlattice laminate 16 of this embodiment is not formed and only the second superlattice laminate 18 is formed as shown in FIG. 2B, section (c), a III nitride semiconductor layer formed on the superlattice laminate does not either have sufficient crystallinity. Thus, high light output power cannot be achieved. In view of this, it is necessary to form the second superlattice laminate 18 on the first superlattice laminate 16 as in this embodiment. The first superlattice laminate 16 is necessary for the formation of a superlattice structure on the AlN buffer layer 14. The AlN buffer layer 14 has a thickness of roughly about 300 nm to 3000 nm. The thickness is essential to the achievement of sufficient crystallinity and evenness of the AlN buffer layer 14 itself. On the other hand, the thickness of each layer in the second superlattice laminate is several nanometers to several tens of nm at most. In addition, the second superlattice laminate includes third layers having low Al content. Therefore, when the second superlattice laminate is formed directly on the AlN buffer layer 14, strong tensile stress is exerted on the second superlattice laminate due to the thickness of the AlN buffer layer 14 in an early stage of the formation of the second superlattice laminate, which would result in formation of cracks. Note that this constraint is minimized when the emission wavelength approximates to the wavelength of AlN (210 nm), and the second superlattice laminate can be formed directly thereon.

Preferable Al content of the layers in the first superlattice laminate 16 and the second superlattice laminate 18 will be described below.

The condition $z-x \geq 0.20$ is preferably satisfied. When $z-x$ is less than 0.20, small difference in the Al content between the third layers 18A and the fifth layers 18C of the second superlattice laminate would inhibit achievement of a sufficient strain buffer effect.

In terms of positively preventing the formation of cracks, the difference in the Al content between adjacent layers in the first and second superlattice laminate, namely, $b-a$, $z-y$, and $y-x$ is preferably 0.05 to 0.40. When the difference exceeds 0.40, as described above with reference to FIG. 3, excessive tensile stress is applied to a layer having higher Al content than adjacent layers, which would results in the formation of cracks due to poor crystallinity. Moreover, when the difference is less than 0.05, the layers cannot be distinguished from one another by the difference in the Al content, and thus the superlattice laminate is less effective.

It is preferable that $y-x$ is smaller than $z-y$. This can reduce the difference in the Al content between adjacent layers in the Al content range of poor crystallinity shown in FIG. 3; thus, the formation of cracks can be more positively prevented.

In terms of sufficiently achieving the advantageous effect of the present invention, the third layers 18A and the fourth layers 18B in the second superlattice laminate preferably meet the conditions $0.20 \leq x < 0.90$ and $0.60 \leq y < 0.95$, respectively.

The first layers 16A in the first superlattice laminate preferably meet the condition $a > x$, and more preferably meet the condition $0.60 \leq a < 0.95$. When a is less than 0.60, cracks would be formed when the second superlattice laminate is formed.

In the first superlattice laminate 16, the thickness of the first layers 16A and the second layers 16B, and the number of layer sets (each including a first layer and a second layer) in the laminate can be set as appropriate. In the first superlattice laminate 16, the thickness of the layers 16A and 16B is preferably set to 0.1 nm to 50 nm. Further, as the Al content (Al content ratio) is lower, the film thickness is preferably set to be larger. The number of the layer sets may be, for example, 10 to 100.

In the second superlattice laminate 18, the thickness of the third layers 18A, the fourth layers 18B, and the fifth layers 18C, and the number of layer sets (each including a third layer, a fourth layer, and a fifth layer) in the laminate can be set as appropriate. In the second superlattice laminate 18, the thickness of the layers 18A, 18B, and 18C is preferably set to 0.1 nm to 50 nm. The number of layer sets is preferably 10 to 100, more preferably 30 to 50. Ten layer sets or more can positively achieve the strain buffer effect, whereas 100 layer sets or less can mitigate the formation of cracks in the III nitride laminate 20.

The layer in the first superlattice laminate 16 closest to the substrate 12 and the layer in the first superlattice laminate 16 closest to the second superlattice laminate 18 may either be a first layer 16A or a second layer 16B. When the layer in the first superlattice laminate 16 closest to the substrate 12 is a second layer made of AlN, the second layer may be an AlN buffer layer 14. When the layer in the first superlattice laminate 16 closest to the substrate 12 is a first layer or a second layer made of other than AlN, an AlN buffer layer 14 is additionally provided. In addition, an AlN template substrate in which an AlN buffer layer 14 is formed on the substrate 12 may be used. On this occasion, an additional AlN buffer layer 14 may be optionally formed on the AlN template substrate. When the AlN template substrate is formed in a furnace other than the furnace in which the buffer layer is epitaxially grown, it is preferable to form the additional AlN buffer layer 14.

The layer in the second superlattice laminate 18 closest to the first superlattice laminate 16 and the layer in the second superlattice laminate 18 closest to the III nitride laminate 20 may be whichever of a third layer 18A, a fourth layer 18B, and a fifth layer 18C; however, the third layer 18A is preferably in contact with the first superlattice laminate 16. Further, an interlayer such as a layer containing Mg or an i-type layer which is not described in the embodiments or another superlattice laminate may be provided between the second superlattice laminate 18 and the III nitride laminate 20 on the second superlattice laminate 18. Even in this case, the second superlattice laminate 18 favorably serves to advantageously improve the crystallinity.

In this specification, "AlGaN" forming the buffer layer may contain other Group III elements such as B and/or In up to a total amount of 1%. Further, "AlGaN" may contain a slight amount of impurities such as for example Si, H, O, C, Mg, As, and P. Furthermore, Mg impurities may be designed to be partially added. Note that GaN, AlGaN, and the like that form a III nitride laminate may also contain other Group III elements up to a total amount of 1%.

As an epitaxial growth method for each layer in the present invention, a known method such as MOCVD or MBE can be used. Examples of a source gas used in the case of forming AlGaN include TMA (trimethylaluminum), TMG (trimethylgallium), and ammonia. The Al content of each layer can be adjusted by controlling the mixing ratio of TMA and TMG. Further, for the evaluation of the Al content and the layer thickness after the epitaxial growth, a known method using optical reflectance, TEM-EDS, photoluminescence, or the like can be used.

The III nitride epitaxial substrate 10 of this embodiment can be used for a deep ultraviolet light emitting device. For example, the III nitride semiconductor layer 20 is partially removed to expose the n-type AlGaN layer 22, and an n-side electrode and a p-side electrode are arranged on the exposed n-type AlGaN layer 22 and the p-type GaN contact layer 28, respectively. Thus, a Group III nitride light emitting device having a lateral structure can be formed. Alternatively, a light emitting device having a vertical structure may be formed after a junction layer is formed on the p-type GaN contact layer 28 to be attached to another support substrate and the substrate is removed by laser or the chemical lift-off process.

The present invention will be described below in more detail using examples. However, the present invention is not limited to the following examples.

EXAMPLES

Example 1

An AlN template substrate was prepared in which an AlN layer (thickness: 0.8 μm) was formed as a buffer layer on a sapphire substrate (thickness: 430 μm). A first superlattice laminate and a second superlattice laminate shown in FIG. 2A, section (a) were epitaxially grown sequentially on this AlN template substrate. The first superlattice laminate includes first layers ($Al_{0.85}Ga_{0.15}N$, a=0.85, thickness: 40 nm) and second layers (AlN, b=1, thickness: 7.2 nm) which are alternately stacked. One of the second layers was first formed on the AlN template substrate, and then 15 pairs of the first layers and the second layers were stacked thereon. Accordingly, the layers are collectively expressed as 15.5 pairs in FIG. 2, section (a). The second superlattice laminate includes 20 repeated layer sets of third layers ($Al_{0.75}Ga_{0.25}N$, x=0.75, thickness: 4 nm), fourth layers ($Al_{0.85}Ga_{0.15}N$, y=0.85, thickness: 17 nm), and fifth layers (AlN, z=1, thickness: 11 nm) which are stacked in this order. As a growth method, MOCVD was used using TMA (trimethylaluminum), TMG (trimethylgallium), and ammonia as source materials. Nitrogen and hydrogen were used for a carrier gas. The growth conditions on each of the first to fifth layers were set at a pressure of 10 kPa and a temperature of 1150° C. Further, the Al content of each layer was adjusted by controlling the supply ratio between TMA and TMG.

After that, an n-type AlGaN layer (Al content β: 0.64, thickness: 1480 nm, dopant: Si), an active layer (AlGaN-based MQW layer, thickness: 270 nm, Al content α in the well layer: 0.40), a p-type AlGaN layer (a composition graded layer having an Al content of 0.75 to 0.32, thickness: 90 nm, dopant: Mg), and a p-type GaN contact layer (thickness: 66 nm, dopant: Mg) were epitaxially grown sequentially on the second superlattice laminate. Thus, a III nitride epitaxial substrate of Example 1 was fabricated. The wavelength of light emitted from the light emitting layer was 280 nm.

Example 2

A III nitride epitaxial substrate of Example 2 was fabricated by the same method to that used in Example 1 except that the number of the layer sets in the second superlattice laminate was changed to 40.

Comparative Example 1

A III nitride epitaxial substrate of Comparative Example 1 was fabricated by the same method to that used in Example 1 except that the superlattice laminate was replaced with the one shown in FIG. 2A, section (b). This superlattice laminate includes 40 pairs of first layers ($Al_{0.85}Ga_{0.15}N$, a=0.85, thickness: 15 nm) and second layers (AlN, b=1, thickness: 10 nm) which are alternately stacked. One of the second layers was first formed on the AlN template substrate.

Comparative Example 2

A III nitride epitaxial substrate of Comparative Example 2 was fabricated by the same method to that used in Example 1 except that the superlattice laminate was replaced with the one shown in FIG. 2A, section (c). This superlattice laminate includes a first superlattice laminate and a second superlattice laminate. The first superlattice laminate includes first layers ($Al_{0.85}Ga_{0.15}N$, a=0.85, thickness: 15 nm) and second layers (AlN, b=1, thickness: 10 nm) which are alternately stacked. One of the second layers was first formed on the AlN template substrate, and then 40 pairs of the first layers and the second layers were stacked thereon. Accordingly, the layers are collectively expressed as 40.5 pairs in FIG. 2A, section (c). The second superlattice laminate includes 20 pairs of first layers ($Al_{0.85}Ga_{0.15}N$, d=0.85, thickness: 10 nm) and third layers ($Al_{0.66}Ga_{0.34}N$, c=0.66, thickness: 15 nm) which are alternately stacked in this order.

Comparative Example 3

A III nitride epitaxial substrate of Comparative Example 3 was fabricated by the same method to that used in Example 1 except that the superlattice laminate was replaced with the one shown in FIG. 2B, section (a). This superlattice laminate includes first layers (GaN, a=0, thickness: 0.3 nm) and second layers (AlN, b=1, thickness: 7.8 nm) which are alternately stacked. One of the second layers was first formed on the AlN template substrate, and then 40 pairs of the first layers and the second layers were stacked thereon. Accordingly, the layers are collectively expressed as 40.5 pairs in FIG. 2B, section (a).

Comparative Example 4

A III nitride epitaxial substrate of Comparative Example 4 was fabricated by the same method to that used in Example 1 except that the superlattice laminate was replaced with the one shown in FIG. 2B, section (b). This superlattice laminate includes first layers ($Al_{0.53}Ga_{0.47}N$, a=0.53, thickness: 10 nm) and second layers (AlN, b=1, thickness: 5 nm) which are alternately stacked. One of the second layers was first formed on the AlN template substrate, and then 40 pairs of the first layers and the second layers were stacked thereon. Accordingly, the layers are collectively expressed as 40.5 pairs in FIG. 2B, section (b).

Comparative Example 5

A III nitride epitaxial substrate of Comparative Example 5 was fabricated by the same method to that used in Example 1 except that the superlattice laminate was replaced with the one shown in FIG. 2B, section (c). This example is the same as Example 1 except that the first superlattice laminate is not formed.

Example 3

This example is the same to Example 1 except that a III nitride epitaxial substrate with an emission wavelength of 340 nm was fabricated by epitaxially growing an n-type AlGaN layer (Al content β: 0.29, thickness: 1680 nm, dopant: Si), an active layer (AlGaN-based MQW layer, thickness: 290 nm, Al content α in the well layer: 0.03), a p-type AlGaN layer (a composition graded layer having an Al content of 0.49 to 0.32, thickness: 80 nm, dopant: Mg), and a p-type GaN contact layer (thickness: 66 nm, dopant: Mg) sequentially on the second superlattice laminate of Example 1.

Example 4

This example is the same to Example 3 except that 15.5 pairs of first layers ($Al_{0.75}Ga_{0.25}N$, a=0.75, thickness: 40 nm)

and second layers (AlN, b=1, thickness: 7.2 nm) were alternately stacked in the first superlattice laminate, and 20 repeated layer sets of third layers ($Al_{0.4}Ga_{0.6}N$, x=0.4, thickness: 4 nm), fourth layers ($Al_{0.65}Ga_{0.35}N$, y=0.65, thickness: 15 nm), and fifth layers (AlN, z=1, thickness: 5 nm) were stacked in the second superlattice laminate, Example 5

This example is the same to Example 3 except that the second superlattice laminate of Example 4 was formed as a third superlattice laminate on the second superlattice laminate of Example 3.

Comparative Example 6

This comparative example is the same to Comparative Example 2 except that a III nitride epitaxial substrate with an emission wavelength of 340 nm was fabricated by epitaxially growing the n-type AlGaN layer, the active layer, the p-type AlGaN layer, and the p-type GaN contact layer of Example 3 sequentially on the superlattice laminate of Comparative Example 2.

(Evaluation 1: Crystallinity of N-type AlGaN Layer)

Half-widths (FWHM) with respect to the (002) plane and the (102) plane in the n-type AlGaN layer of the samples of Examples and Comparative Examples were measured using an X-ray diffractometer (D8 DISCOVER, manufactured by Bruker AXS). The half-widths are indications for evaluating the crystallinity, and lower half-width values correspond to better crystallinity. The results are shown in Table 1.

(Evaluation 2: PL Intensity Ratio)

A PL measurement (photoluminescence measurement) was performed on each sample of Examples and Comparative Examples using a PL apparatus manufactured by PHOTON Design Corporation. In the PL measurement, each sample was irradiated with laser with an energy higher than the band gap energy of the semiconductor layer to once excite electrons in the semiconductor layer to a high energy level, and the redundant energy (emitted as light energy) generated when the energy level returns to the original energy level was measured. The light energy can be converted to a wavelength. With this measurement, the Al content and the number of point defects of each layer can be evaluated. In the measurement for this evaluation, the PL intensity at the PL emission wavelength of a light emitting layer having the lowest Al content was divided by the PL intensity at a wavelength (495 nm) at which the PL intensity typically becomes higher resulting from point defects, thereby calculating the PL intensity ratio. From this PL intensity ratio, how easily the light emitting layer emits light can be evaluated. This is because, as point defects are increased, light emission is reduced due to the defects, which results in low light output when a current is applied. In this measurement, laser with a wavelength of 244 nm with a power output of 70 mW was used. The results are shown in Table 1.

(Evaluation 3: Light Output Power Po)

For each sample of Examples and Comparative Examples, the growth surface was scribed with a diamond pen; indium dots were physically pressed against a point where the n-type AlGaN layer was exposed and a point on the p-type GaN contact layer 1.5 mm apart from the exposed point. Thus, a simple nitride semiconductor device using the formed two points as an n-type electrode and a p-type electrode was fabricated. Then, probes were put on those points, light after current application was output from the rear surface, and the light was guided to a multi-channel spectrometer manufactured by Hamamatsu Photonics K.K. through an optical fiber. The peak intensity of the spectrum was converted to W (watts) to find the light output power Po. The results are shown in Table 1.

TABLE 1

| | Emission wavelength | n-AlGaN Crystallinity (002) (s) | n-AlGaN Crystallinity (102) (s) | PL intensity ratio | Light output power Po (mW) |
|---|---|---|---|---|---|
| Example 1 | 280 nm | 229 | 394 | 4.2 | 0.889 |
| Example 2 | | 225 | 374 | 7.0 | 1.199 |
| Comparative Example 1 | | 304 | 592 | 3.2 | 0.213 |
| Comparative Example 2 | | 512 | 962 | 0.3 | 0.172 |
| Comparative Example 3 | | 289 | 531 | 2.1 | 0.452 |
| Comparative Example 4 | | Measurement could not be performed due to crack formation | | | |
| Comparative Example 5 | | 298 | 580 | 2.6 | 0.280 |
| Example 3 | 340 nm | 245 | 540 | 5.4 | 0.584 |
| Example 4 | | 236 | 523 | 6.6 | 0.852 |
| Example 5 | | 239 | 492 | 5.2 | 0.785 |
| Comparative Example 6 | | 353 | 587 | 5.2 | 0.357 |

Cases where the emission wavelength was 280 nm (Examples 1 and 2, and Comparative Examples 1 to 5) will be described. As shown in Table 1, in each of Examples 1 and 2, cracks were not formed in the superlattice laminate or the III nitride laminate thereon, and the crystallinity of the n-AlGaN layer was favorable as compared with Comparative Examples, which is presumed to have resulted in good crystallinity of the active layer. In fact, the PL intensity ratio and the light output power Po were better than those in Comparative Examples 1 to 5. On the other hand, in Comparative Example 4, cracks were formed in the superlattice laminate. Accordingly, any of Evaluations 1 to 3 could not be carried out. Further, in Comparative Examples 1 to 3 and 5, cracks were not formed; however, they were inferior to Examples 1 and 2 in crystallinity of the n-AlGaN layer and in PL intensity ratio and light output power Po as well. In Example 2 in which the number of the layer sets in the second superlattice laminate was increased, even better PL intensity ratio and light output power were achieved as compared with Example 1.

Also in cases where the emission wavelength was 340 nm (Examples 3 to 5 and Comparative Example 6), the similar results were successfully obtained. Because a 340 nm LED originally has a small number of point defects, the relationship between the PL intensity ratio and the light output power could not have been revealed, whereas better crystallinity was successfully achieved with higher light output power. Thus, crystallinity improved by implementing the present invention lead to improved light output power.

INDUSTRIAL APPLICABILITY

The present invention can provide a III nitride epitaxial substrate which makes it possible to obtain a deep ultraviolet light emitting device with improved light output power, and can provide a deep ultraviolet light emitting device with improved light output power.

REFERENCE SIGNS LIST

| | |
|---|---|
| 10: | III nitride epitaxial substrate |
| 12: | Substrate |
| 14: | AlN buffer layer |
| 16: | First superlattice laminate |
| 16A: | First layer ($Al_aGa_{1-a}N$) |
| 16B: | Second layer ($Al_bGa_{1-b}N$) |
| 18: | Second superlattice laminate |
| 18A: | Third layer ($Al_xGa_{1-x}N$) |
| 18B: | Fourth layer ($Al_yGa_{1-y}N$) |
| 18C: | Fifth layer ($Al_zGa_{1-z}N$) |
| 20: | III nitride laminate |
| 22: | N-type AlGaN layer |
| 24: | Active layer |
| 26: | P-type AlGaN layer |
| 28: | P-type GaN contact layer |

The invention claimed is:

1. A III nitride epitaxial substrate comprising:
a substrate;
an AlN buffer layer formed on the substrate;
a first superlattice laminate and a second superlattice laminate sequentially formed on the buffer layer; and
a III nitride laminate having an active layer including an $Al_\alpha Ga_{1-\alpha}N$ ($0.03 \leq \alpha(\text{alpha})$) layer epitaxially grown on the second superlattice laminate, wherein:
the first superlattice laminate includes a first layer made of $Al_aGa_{1-a}N$ and a second layer made of $Al_bGa_{1-b}N$ ($0.9 \leq b \leq 1$) which are alternately stacked,
where $\alpha(\text{alpha}) < a$ and $a < b$: hold, and
the second superlattice laminate includes repeated layer sets each layer set having a third layer made of $Al_xGa_{1-x}N$ ($0.20 \leq x \leq 0.90$), a fourth layer made of $Al_yGa_{1-y}N$ ($0.60 \leq y \leq 0.95$), and a fifth layer made of $Al_zGa_{1-z}N$ ($0.9 < z \leq 1$), where $\alpha(\text{alpha}) < x$ and $x < y < z$, and $y-x$ is smaller than $z-y$,
and the bottom most layer of the second superlattice laminate is the third layer.

2. The III nitride epitaxial substrate according to claim 1, wherein $0.02 \leq z-x$.

3. The III nitride epitaxial substrate according to claim 1, wherein $0.05 \leq b-a \leq 0.40$, $0.05 \leq z-y \leq 0.40$, and $0.05 \leq y-x \leq 0.40$.

4. A deep ultraviolet light emitting device using the III nitride epitaxial substrate according to claim 1.

5. The III nitride epitaxial substrate according to claim 1, wherein $x < a$.

6. The III nitride epitaxial substrate according to claim 1, wherein the substrate is made of a material selected from the group consisting of sapphire, SiC, and diamond.

* * * * *